United States Patent [19]

Eggenberger et al.

[11] Patent Number: 5,617,432
[45] Date of Patent: Apr. 1, 1997

[54] COMMON ERROR PROTECTION CODE FOR DATA STORED AS A COMPOSITE OF DIFFERENT DATA FORMATS

[75] Inventors: John S. Eggenberger, Shingle Springs; Paul Hodges; Norman K. Ouchi, both of San Jose; David A. Plomgren, San Carlos, all of Calif.

[73] Assignee: International Business Machines Corporation, Armonk, N.Y.

[21] Appl. No.: 585,002

[22] Filed: Jan. 5, 1996

Related U.S. Application Data

[63] Continuation of Ser. No. 336,614, Nov. 9, 1994, abandoned.

[51] Int. Cl.$^6$ .................................................. G06F 11/08
[52] U.S. Cl. .......................... 371/37.1; 360/48; 371/37.7; 395/872
[58] Field of Search ............................... 371/37.7, 37.1; 395/872, 875; 360/48

[56] References Cited

U.S. PATENT DOCUMENTS

| | | | |
|---|---|---|---|
| 3,508,194 | 4/1970 | Brown | 371/40.1 |
| 3,641,534 | 2/1972 | Irwin | 360/51 |
| 3,821,703 | 6/1974 | Devore et al. | 371/37.1 |
| 4,185,269 | 1/1980 | Hodges et al. | 371/39.1 |
| 4,223,390 | 9/1980 | Bowers et al. | 360/48 |
| 4,929,946 | 5/1990 | O'Brien et al. | 341/87 |
| 5,206,939 | 4/1993 | Yanai et al. | 395/404 |
| 5,301,304 | 4/1994 | Menon | 395/500 |
| 5,388,013 | 2/1995 | Nakamura | 360/48 |
| 5,440,474 | 8/1995 | Hetzler | 360/48 |

Primary Examiner—Kenneth S. Kim
Attorney, Agent, or Firm—Esther E. Klein; Henry E. Otto, Jr.

[57] ABSTRACT

A data processing system and method providing error protection for data transmitted between a processor and a buffer in one data format and transmitted between the buffer and a user device in a different data format. An adaptor is interposed between the processor and the buffer for transmitting to the buffer (i) successive data segments in the one data format, each ending with appended check bytes in a preselected cyclic redundancy code (CRC); and (ii) check bytes using the same CRC appended at the end of each segment in the different data format to create in the buffer records which are a composite of both formats, but viewed as in the one data format by the processor and as in the different data format by the user device. The boundaries of the segments in each format must be known to the adaptor. Since both formats use the same CRC, CRC bytes for each segment in each data format will provide an identical preselected value in the absence of a detectable error. A second adaptor, which does not and need not know the boundaries of the data segments in the one data format, is interposed between the buffer and the user device for transmitting the data between the buffer and user device in the different data format.

16 Claims, 3 Drawing Sheets

$$BCRC(BP) = BCRC(B0 \oplus B1 \oplus B2 \oplus B3 \oplus B4)$$

COMMON ERROR PROTECTION CODE FOR DATA STORED AS A COMPOSITE OF DIFFERENT DATA FORMATS

This is a continuation of application Ser. No. 08/336,614 filed Nov. 9, 1994 now abandoned.

FIELD OF THE INVENTION

This invention relates to error protection of buffered data that is transferred to and from an upstream processor in one data format (e.g., as variable-length records) and transmitted to and from a user device in another format (e.g., as fixed-length blocks). The invention relates more particularly to a storage system in which data is stored in the buffer as a composite of the two data formats and accessible in either format.

BACKGROUND OF THE INVENTION

Records in count key data (CKD) format comprise count, key and data fields of variable length, thereby creating records whose length varies primarily according to variations in length of the data field. By contrast, records in fixed-block-architecture (FBA) format comprise fixed-length blocks (commonly referred to as "fixed blocks"), with padding bytes used as necessary to fill out a record which does not fill a complete block.

In transferring data between a system and a storage medium through a buffer, it is customary to protect the data against buffer errors by appending cyclic redundancy code (CRC) check bytes to each grouping of data that can be independently read or written at the disk level. For CKD-formatted records, CRC check bytes are appended to each count field, key field and data field before it is stored in the buffer, and the CRC for each field is checked as it is read from the buffer. Similarly, for fixed-block records, CRC bytes are appended to each block of data before it is stored in the buffer and the CRC for each block is checked as it is read from the buffer.

It has become common in the disk drive industry for records that are transmitted to or from a storage subsystem in CKD format to be recorded on the storage medium in fixed-block format. This format change implies that there is a point at which data stored in a buffer is regarded by a processor as a sequence of variable length fields and by a user device, such as a recording disk, as a sequence of fixed blocks. CRC check bytes may be applied based on either format.

If CRC check bytes were appended on the basis of the CKD format, then checking of data read from the buffer in CKD format is straightforward. The CRC for each field is checked as that field is read from the buffer. However, when the data is to be transferred as one or more fixed blocks for recording on disk, the fixed blocks must be checked by reading and checking all CKD fields that contain any part of the blocks to be transferred. For example, if a fixed-length block were to contain the end of CKD field A, all of CKD field B and the beginning of CKD field C, then checking of that fixed block as it is read from the buffer would require reading all of CKD fields A, B and C. Alternatively, if CRC check bytes were appended on the basis of the fixed-block format, then entering a new CKD field would require, for blocks containing data from two or more CKD fields, reading and checking the block, updating the affected bytes, regenerating the check bytes and rewriting the block.

Insofar as applicants are aware, data has not been stored in a buffer as a composite of two different data record formats, such as CKD and FBA, with a common cyclic redundancy code to provide error protection.

U.S. Pat. No. 3,821,703 describes a method and means for translating a variable-length CKD-formatted record into a fixed-length block FBA-formatted record. Since the end of the variable-length CKD record will rarely, if ever, coincide with the end of a fixed-length block, a residual segment is required. Each residual segment comprises the final data bytes of the CKD record and also includes CRC check bytes as transferred through a buffer and padding bytes to complete the particular fixed-length block. An odd number or even number of CRC check bytes is appended according to whether the total number of fixed blocks is odd or even.

U.S. Pat. No. 5,301,304 discloses a method and means for reorienting records written into a buffer to create CKD-emulated records in FBA format by eliminating, from each CKD-formatted record, before it is written to disk, intrarecord gaps and bytes not essential for recreating the record in CKD format. An emulator calculates the number and location of fixed-length blocks required to store each CKD-emulated record in a virtual track on the disk. The CKD-emulated records are written from the buffer to disk via an FBA adaptor in fixed-length blocks containing (i) header data indicating whether or not a CKD-emulated record begins in that block, (ii) byte displacement address, and (iii) padding bytes between each set of adjacent CKD-emulated records, including bytes corresponding to inter-record gaps, to assure that the beginning of each respective CKD-emulated record has the same byte displacement from a reference location on a virtual track on the disk as it would have from an index on a physical track of a CKD-formatted disk. This permits each CKD-emulated record to be accessed in a single revolution of the FBA-formatted disk without requiring a special directory or map list.

There is a need for a method and means for (i) translating data from one format (such as CKD) to another format (such as FBA) reliably with less cost; (ii) eliminating the need for CRC checking, during updating of a record, of all fields except the affected fields of a CKD record contained in one or more fixed-length blocks; (iii) eliminating the need for CRC checking, during reading or updating of a fixed block, of any CKD data outside the boundaries of the block; and (iv) facilitating checking and updating by using the same cyclic redundancy code (CRC) for each CKD field and gap and fixed block to assure that each CKD field and gap are conditioned in the same manner (e.g., zeroed) to provide no contribution to the CRC calculation for the fixed block.

SUMMARY OF THE INVENTION

A data storage system and method are described which provides error protection for count-key-data (CKD)-formatted data transmitted from a processor to a buffer for recording on a fixed-block architecture (FBA)-formatted recording disk in fixed-length blocks.

An adaptor is interposed between the processor and the buffer for transmitting to the buffer (i) a succession of CKD fields, one field at a time, each with a set of field check bytes appended, and (ii) a set of block check bytes appended at the end of each fixed-length block to store in the buffer composite CKD/FBA records viewed by the processor as CKD records and by the disk as fixed-length blocks in FBA format. The boundaries of the fields and fixed-length blocks are and must be known to the adaptor.

A CRC generator is initially set to a preselected value (here, zero) and reset to that value after each successive set of CRC check bytes is appended.

With this arrangement, and according to the invention, each segment of data over which a set of CRC bytes has been generated can be independently checked and independently updated without reference to any other segment. Furthermore, if the CRC reset value is zero, then each segment of data over which a set of CRC bytes is generated produces a zero result when that segment is checked. Any number of such segments, e.g., a fixed-length block containing all or part of several CKD fields, can be read from the buffer and checked without regard for (or even knowledge of) segment boundaries, as long as an integral number of segments is read. Thus, the data in a CKD field, which is segmented at the fixed-block boundaries, can be checked or updated, regardless of the number of fixed-length blocks spanned (entirely or in part), and without reference to any other data in those blocks. Similarly, data in a fixed-length block from the storage medium, which is segmented at the CKD field boundaries, can be checked or updated, regardless of the number of CKD fields included, and without reference to data in any other block.

If the record includes field information following and not protected by the field CRC check bytes, additional CRC check bytes are appended after the field information to provide error protection to ensure that said field information will indicate the preselected value in the absence of a detectable error. If the gap contains only all-zero data, and the reset value for CRC generation is all zeroes, then the CRC check bytes for the gap would also be all zeroes, and there is no need for specific generation and appending of check bytes for the gap.

A second adaptor which does not know and need not know the boundaries of the data segments in CKD format is interposed between the buffer and the DASD for checking fixed-block data read from the buffer and for transmitting the data between the buffer and the DASD in FBA format.

The error protection technique is not limited to conversion between CKD-formatted variable-length records and FBA-formatted records in fixed-length blocks. It can be applied to any system in which data is transferred between a processor and a buffer in one format and between the buffer and a user device (such as a storage disk or a terminal) in another format, provided: (1) the same cyclic redundancy code is used for generating CRC check bytes for use with both data formats, (2) the boundaries between segments in both formats (such as fields and fixed-length blocks) are known at the time the CRC check bytes are generated, and (3) the CRC reset value at each boundary is all zeroes.

The check bytes use the same CRC to provide error protection so that a selected field and its associated CRC check bytes may be updated without requiring reading and updating of the remaining fields or of the block containing the selected field.

Note that if condition (3) above is not met, the technique is still applicable; but in that case, the adaptors must each be cognizant of the boundaries between segments in both formats, or the generation of CRC check bytes must be altered in such a manner that the result of checking a segment in the absence of error is equal to the CRC reset value.

DESCRIPTION OF PREFERRED EMBODIMENT

Figures 1A, 1B:
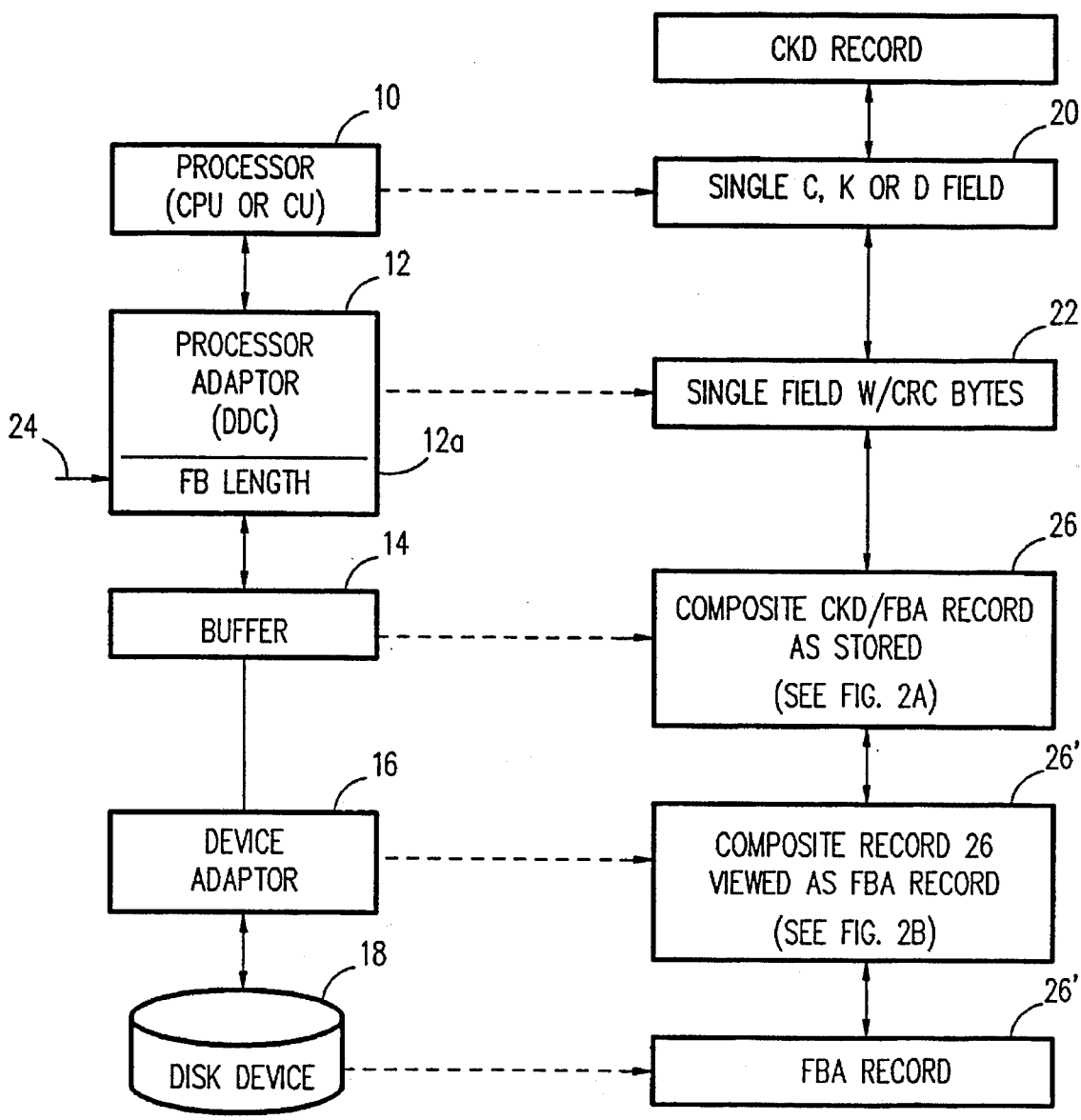
FIG. 1A is a block diagram of various components of a disk storage system embodying the invention.
FIG. 1B depicts the nature of the record as it exists in the specific system component to which it is shown laterally adjacent.

As illustrated in FIG. 1A, a disk storage system embodying the invention comprises a processor 10, such as a control unit or CPU; a processor adaptor 12, such as a DDC controller; a buffer 14; a device adaptor 16; and a disk device 18, such as a direct access storage device (DASD). As illustrated in FIG. 1B, processor 10 may transmit a single count field, key field, or data field 20 to processor adaptor 12 without CRC check bytes. Processor adaptor 12 will generate CRC check bytes to provide, as record 22, a field with CRC check bytes appended.

Figures 2A, 2B:
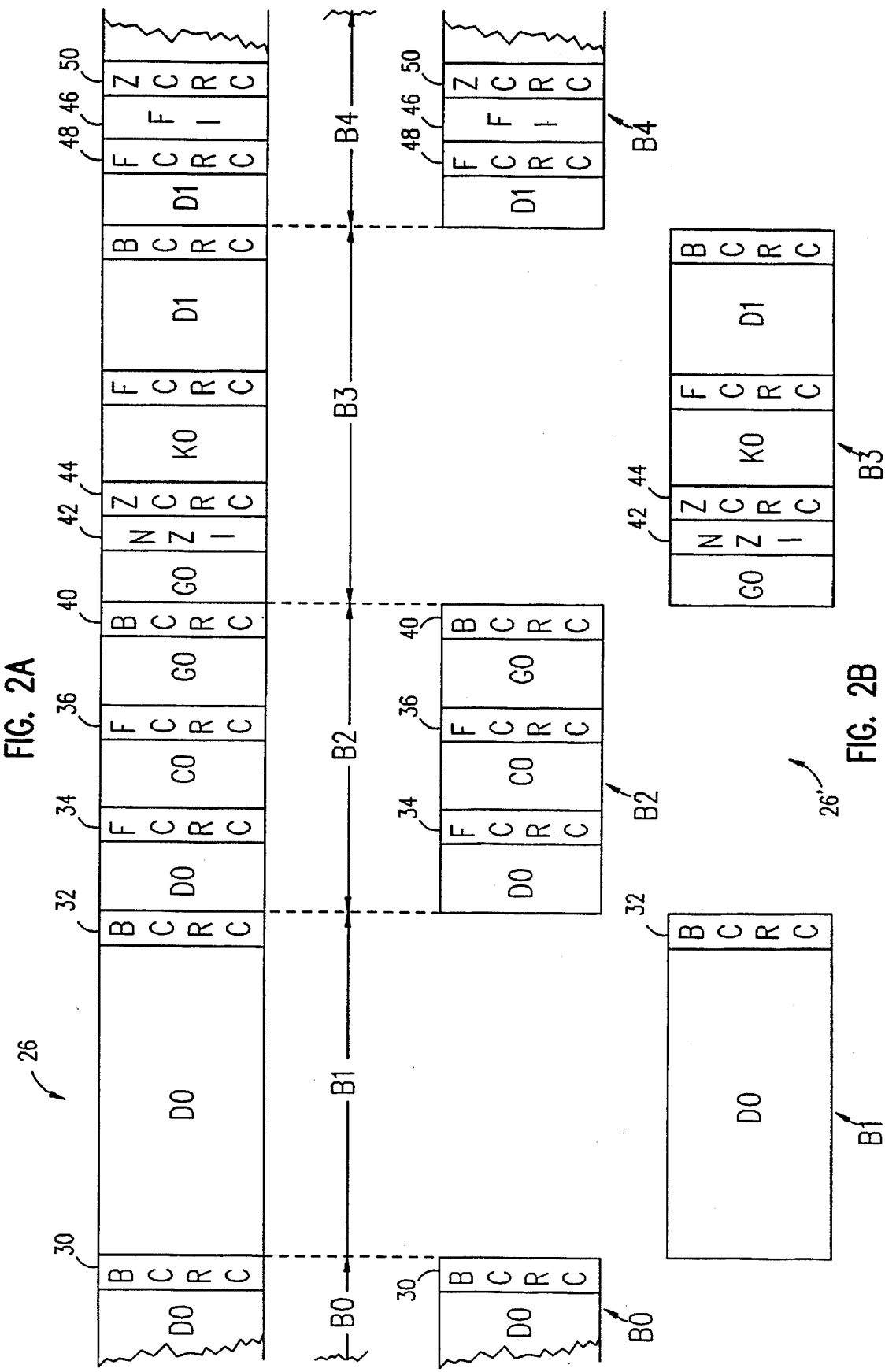
FIGS. 2A and 2B, when taken together, depict a composite CKD/FBA record as stored in a buffer, with FIG. 2A depicting how the record is viewed by the processor adaptor of FIG. 1A, and FIG. 2B depicting how the record is viewed by the device adaptor of FIG. 1A.

To implement the invention, processor adaptor 12 must know the number of bytes in the fixed-length blocks as well as in the CKD fields including gaps. Hence, according to a feature of the invention, this length information for the fixed-length blocks is input at 24 to a circuit 12a to enable the processor adaptor 12 to output a composite CKD/FBA record 26. As illustrated in FIG. 2A, this composite record 26 is created by transmitting from processor adaptor 12 to buffer 14 and storing there successive fields, each with field CRC (FCRC) bytes and with block CRC (BCRC) bytes appended at the end of each fixed-length block.

It is essential that the same cyclic redundancy code be used for the CKD fields and gaps in the composite CKD/FBA record as for the fixed-length blocks. It is herein assumed that, in the absence of a detectable error, the code causes all fields to be "zeroed" by the FCRC bytes, i.e., produce a sequence of bytes which when passed through adaptor 12 or adaptor 16 results in a zero syndrome. Thus, the FCRC bytes will not influence the computation of the BCRC bytes, and they will remain zeroed unless a CRC-detectable error occurs in the segment of the field encompassed by the BCRC bytes. If a field is updated in the buffer, the associated FCRC bytes are updated to maintain the zeroed condition.

Obviously, the end of a CKD record, or even a field of a CKD record, will rarely coincide with the end of a fixed block. As illustrated in FIG. 2A, CKD field D0 begins in block B0, extends across full-block B1, and ends within block B2. BCRC bytes 30, 32 are appended at the ends of blocks B0, B1, respectively, and FCRC bytes 34 are appended at end of field D0.

In the absence of error, BCRC bytes 30, 32 and 40 will have zero syndromes when those blocks are read and checked. If there is a CRC-detectable error in one of the blocks, the BCRC syndrome for that block will be non-zero. Therefore, the BCRC bytes provide error protection for the portions of CKD fields that reside in blocks B0, B1 and B2, respectively, when those blocks are read from the buffer. It is not necessary that the FCRC bytes within a block be specifically identified in performing the CRC check on a block.

In the absence of error, FCRC bytes 34 will have a zero syndrome when the entire field D0 is read and checked. If there is a CRC-detectable error anywhere in the field, the FCRC syndrome for D0 will be non-zero. Therefore, the FCRC bytes 34 provide error protection for the field D0 when that field is read from the buffer. It is not necessary that the BCRC bytes within a field be specifically identified when performing the CRC check on the CKD field.

As illustrated, a CKD field C0 is completely contained within a single block B2. FCRC bytes 36 appended at the end of field C0 will, in the absence of error, have a zero syndrome and thus provide error protection for field C0. BCRC bytes 40 at the end of block B2 split gap G0. BCRC bytes 40 will, in the absence of error, have a zero syndrome and take care of any non-zero information in that portion of gap G0 within block B2. But, if, as illustrated, the terminal portion of gap G0 contains non-zero information (NZI) 42, zeroing CRC (ZCRC) bytes 44 are needed to provide error protection for the terminal portion of gap G0.

The remaining fields following ZCRC 44 illustrate additional instances of scenarios above described, except for block B4 in which field information (FI) 46 follows, and hence is not protected by, FCRC bytes 48 for the terminal portion of field D1. ZCRC bytes 50 are therefore added after FI 46 to ensure zeroing of the FI.

The composite CKD/FBA record 26 depicted in FIG. 2A is viewed by device adaptor 16 as a fixed-block record 26' with separately accessible blocks B0–B4 (shown offset in FIG. 2B to facilitate conceptualization).

In operation, a CRC generator (not shown) is provided in processor adaptor 12 to append the CRC check bytes, as earlier stated. This CRC generator may be of conventional type comprising shift registers and exclusive OR (XOR) logic. At the end of each CKD field, FCRC bytes are appended; and at the end of each pre-established fixed-block length, BCRC bytes are appended. ZCRC bytes are appended where required, as above stated.

According to a feature of the invention, the CRC generator is always reset to zero after the FCRC, BCRC and any ZCRC bytes are appended. The FCRC bytes and any required ZCRC bytes ensure that each field and gap and non-BCRC-protected field information will be zeroed, and the BCRC bytes at the end of each fixed block will also zero that block.

Thus, in summary, if a CKD field and its appended CRC check bytes are completely within a block, they will be equivalent to a sequence of zeroes for the purpose of checking the BCRC bytes. Any CKD field can be changed and new FCRC bytes calculated just for that field without changing the BCRC bytes. On the other hand, if a CKD field crosses a block boundary, it becomes divided at the boundary and each portion is protected. The CRC check bytes for the leading portion of the CKD field (the portion that completes the block) are actually the BCRC bytes for the block. (Since all other CKD fields are zeroed, they do not contribute to the calculation of the BCRC bytes.) The CRC generator is reset at the block boundary and the trailing portion of the CKD field (that is, in the second block) is zeroed by its appended FCRC bytes with respect to the BCRC bytes of the second block. If this CKD field is changed, only the CRC check bytes for those portions actually changed need to be modified. The BCRC bytes for the second block are not affected, and no other data in that block need be accessed to maintain error protection. Thus, each CKD field is protected by CRC check bytes that are computed each time the field is changed. The fixed-block record is protected by BCRC bytes which do not require independent recomputation when the CKD fields are changed.

To check data as it is read from buffer 14 to disk device 18, the CRC generator in device adaptor 16 is initialized to zero. Data is then entered from a selected fixed block into adaptor 16. Each block contains one or more CRC-checked fields and gaps, each of which will generate a zero syndrome in the absence of a detectable error or a non-zero syndrome if there is a detectable error.

To read a variable-length record from buffer 14 to processor 10, the CRC generator in processor adaptor 12 is initialized to zero. Data is then entered from a selected variable-length record consisting of less than one, one, or more than one fixed-length block. Again, a field, gap or block will generate a non-zero syndrome only if it contains a detectable error.

To update write from processor 10, the data is received from disk device 18 and stored in buffer 14 as a series of fixed-length blocks which contain the fields to be updated. This data is seen by the processor 10 as a CKD track (or a portion thereof). A CKD field, which may be a part of a block or which may span multiple blocks, is received from processor 10 and replaces the corresponding data in the buffer. Subsequently, the fixed-length block(s) containing the changed data are transmitted to the device 18 for writing.

The FCRC check bytes for the variable length fields are retained in storage in disk device 18; however, BCRC check bytes may be retained in storage or regenerated when the fixed-length blocks are read from storage. In either event, fixed blocks read from disk device 18 and transmitted to buffer 14 will contain the same CRC check bytes as were generated when the data was received from processor 10. Data read from buffer 14 will be transmitted to processor 10 as variable-length fields with the above-described CRC check bytes removed by processor adaptor 12. Note that despite the fact that the device adaptor 16 does not know the boundaries of the CKD fields, all CKD fields are fully error protected.

Figure 3:
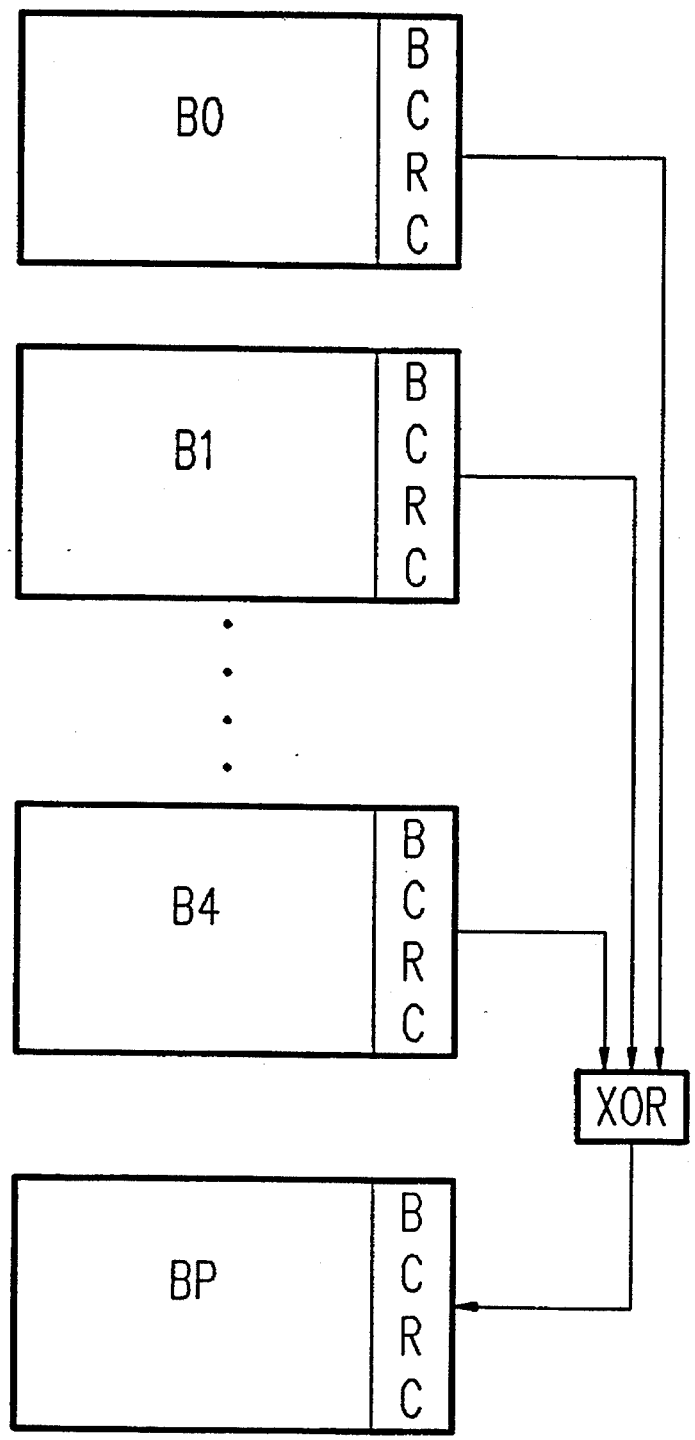
FIG. 3 is a block diagram for a redundant array of independent disks (RAID) configuration of direct access storage devices (DASDs) to which the invention may be applied.

In DASD array configurations, commonly referred to as Redundant Arrays of Independent Disks (RAIDs), a set of fixed blocks are processed through an exclusive OR (XOR) to create an additional block constituting a parity block that can be used to recreate a block of the set that is lost or in error. Hence, the CRC check bytes for the parity block that results from XORing the set of blocks is the XOR of the CRC check bytes of these blocks. As illustrated in FIG. 3, the block B0–B4 could be used as a set to generate a parity block BP. If only one field (e.g., C0) in one block (e.g., B2) needed to be updated, only that field would be modified. Hence, only FCRC bytes 36 would be changed; and the CRC check bytes in block BP would be recalculated without requiring recalculation of the CRC check bytes in blocks B0, B1, B3 and B4. CKD-formatted variable-length records stored on disk in fixed-length blocks could thus be checked, corrected if necessary by the parity block, transmitted via device adaptor 16 to buffer 14 as composite record 26, and then via processor adaptor 12 as a CKD record to processor 10. In some designs of such arrays, successive fixed-length blocks containing CKD fields are written to different drives, with the timing of write operations being governed by the individual drives. In such a design, it is imperative that each block transferred from the buffer be checked independently.

It should be noted that the error protection technique herein disclosed is not limited to conversion between CKD-formatted variable-length records and FBA-formatted records in fixed-length blocks. It can be applied to any processing system in which data is transferred between a processor and a buffer in one format and between the buffer and a user device (such as a storage disk or a terminal) in another format, provided: (1) the same cyclic redundancy code is used for generating CRC check bytes for use with both data formats, (2) the boundaries between segments in both formats (such as fields and fixed-length blocks) are known at the time the CRC check bytes are generated, and (3) the CRC generator resets to a preselected value (preferably containing only zeroes) after each set of CRC check bytes is appended.

While the invention has been shown and described with respect to a preferred embodiment thereof, it will be understood by those skilled in the art that changes in form and detail may be made in the disclosed embodiment without departing from the scope and teaching of the invention. Accordingly, the method and means herein disclosed are to be considered merely as illustrative, and the invention is to be limited only as specified in the claims.

We claim:

1. A method of error protection for data transmitted between a processor and a buffer segmented into successive segments of known length in one data format and transmitted between the buffer and a data storage device segmented into successive segments of known lengths in a different data format, the method comprising the steps of:

initially setting a cyclic redundancy code (CRC) generator to a preselected value;

using one preselected common CRC algorithm in the CRC generator set to the preselected value, generating a set of CRC check bytes for each of the successive segments of known lengths as determined in said one format and also for each of the segments of known lengths as determined in said different format;

appending the generated sets of CRC check bytes at the end of each corresponding one of said segments in said one format and said segments in said different format for conditioning each such segment to indicate said preselected value in the absence of a detectable error whether the segment be of known lengths in said one format or known lengths in said different format;

resetting the generator to said preselected value after each set of CRC check bytes is appended to one of said segments in said one format or one of said segments in said other format; and storing said data and appended check bytes in the buffer to create a composite data format viewed by the processor as comprising segments of known lengths in said one format and viewed by the data storage device as comprising segments of known lengths in said different format.

2. The method of claim 1, including the step of checking and updating a selected segment in said one format and its appended CRC check bytes without requiring checking and updating of the CRC check bytes and segments in said different format.

3. A method of error protection for data in count-key-data (CKD)—formatted data field boundaries transmitted from a processor to a buffer for recording on a fixed block architecture (FBA)—formatted recording disk in boundaries of fixed-length blocks, comprising the steps of:

initially setting a cyclic redundancy code (CRC) generator to a preselected value;

using one preselected CRC algorithm in the CRC generator set to the preselected value to generate a set of CRC check bytes for each CKD field and each fixed length block, appending after each CKD field and at the end of each fixed-length block the set of CRC check bytes generated for that field and that block, each set indicating said preselected value in the absence of a detectable error in its associated field or block, wherein a block containing all or part of one or more CKD fields can be checked for error using the appended CRC check bytes without regard to CKD field boundaries and a CKD field can be checked for error using the appended CRC check bytes without regard to block boundaries;

resetting said generator to said preselected value after each successive set of CRC check bytes is appended; and storing said CKD fields sequentially in the buffer in fixed-length blocks with their respective field CRC check bytes and block CRC check bytes appended to create a composite CKD/FBA record which is viewed by the processor using the CKD field boundaries as a CKD record and as fixed-length blocks using the block boundaries in FBA format by the disk.

4. The method of claim 3, including the step of checking and updating a selected field and recalculating the CRC check bytes for only that field without recalculating CRC check bytes for other data in any fixed-length block containing all or part of said field.

5. The method of claim 3, wherein said preselected value contains only zeroes.

6. The method of claim 3, wherein said preselected value contains only zeroes, and including the step of adding CRC check bytes at the end of any field or gap in the composite record which contains information other than zeroes to ensure that the field or gap including said other information will indicate zeroes in the absence of a detectable error.

7. The method of claim 3, including the step of using the block CRC check bytes at the end of the first of two adjacent fixed-length blocks to error protect the first part of a field split between said two adjacent fixed-length blocks.

8. The method of claim 3, including the step of, for a field having (a) a first segment partially in a first fixed-length block, (b) N segments extending fully across N fixed-length blocks, where $N \geq 1$ and (c) a final segment terminating in an $(N+1)$th fixed-length block, using the block CRC check bytes at the ends of the first and N blocks to error protect said first and N segments and using field CRC check bytes to error protect the final segment.

9. The method of claim 3, where $N \geq 2$, and including the step of, for a field that spans N fixed-length blocks having (a) a first segment partially in the first fixed-length block, (b) (N–2) segments that extend fully across (N–2) fixed-length blocks, and (c) a last segment terminating in the Nth fixed-length block, using block CRC check bytes at the end of the first and (N–2) blocks to error protect the corresponding first and (N–2) segments and using field CRC check bytes to error protect said last segment in the Nth block.

10. For use in a data processing system which provides error protection for data transmitted between a processor and a buffer in one data format, wherein the data comprises successive segments of known variable boundaries, and transmitted between the buffer and a data storage device in a different data format wherein the data comprises successive segments of known fixed boundaries, an adapter interposed between the processor and buffer comprising:

means for transmitting to the buffer successive data segments of known variable boundaries, each ending with appended check bytes generated using a preselected cyclic redundancy code (CRC) algorithm; and means for appending check bytes, generated using said preselected CRC algorithm, at the end of each of the successive segments of known fixed boundaries in the buffer, to create a composite data format, wherein the processor knows the data as being in said one data format comprising segments of known variable boundaries and the data storage device knows the data as being in said different data format, comprising segments of known fixed boundaries, wherein the adapter knows the boundaries of the segments in both said one data format and said different data format, wherein said check bytes for each said data format provides an identical preselected value in the absence of a detectable error.

11. In the system of claim 10:

a second adaptor which does not know the boundaries of said segments in said one data format and is interposed between the buffer and the data storage device for transmitting the data between the buffer and the data storage device in said different data format.

12. A data processing system comprising:

a processor;

a buffer;

a first adaptor interposed between the processor and the buffer for transmitting to the buffer in one data format successive data segments of known variable boundaries, each with a respective set of check bytes appended, and also for transmitting to the buffer, a set of check bytes appended at the end of each segment of known fixed boundaries which is in a different data format to store in the buffer a record which is a composite of both said one and said different formats and said check bytes, the known boundaries of said segments in said one and different formats being known to said first adaptor;

a data storage device; and a second adaptor interposed between the buffer and the data storage device for transmitting the composite record to said data storage device stored as segments of known fixed boundaries in said different format, all of said check bytes using the same cyclic redundancy code (CRC) to provide error protection to thereby eliminate the need for reading or updating segments and check bytes in said different format when a segment in said one format and its associated CRC check bytes are updated.

13. The data processing system of claim 12, wherein said first adaptor includes a CRC generator using a preselected CRC algorithm and set to a preselected value for generating the check bytes, said generator being reset to the preselected value after appending any of said sets of check bytes.

14. The data processing system of claim 13, wherein said preselected value consists only of zeroes.

15. An article of manufacture for use in a computer system for error protecting data transmitted between a processor and a buffer in one data format wherein the data comprises successive segments of known lengths and transmitted between the buffer and a data storage device in a different data format, wherein the data comprises successive segments of known lengths, said article of manufacturer comprising a computer readable storage medium having computer program code embodied in said medium which may cause the computer to:

initially set a cyclic redundancy code (CRC) generator to a preselected value;

use one preselected common CRC algorithm in the CRC generator set to the preselected value, to generate a set of CRC check bytes for each of the successive segments of known lengths, as determined in said one format and also for each of the successive segments of known lengths as determined in said different format;

appending the generated set of CRC check bytes at the end of the corresponding one of said segments in said one format and said different format for conditioning each such segment to indicate said preselected value in the absence of a detectable error whether the segment be in said one format or different format;

reset the generator to said preselected value after each set of CRC check bytes is appended to one of said segments in said one format or one of said segments in said different format; and store said data and appended check bytes in the buffer to create a composite record viewed by the processor as comprising segments of known lengths in said one format and viewed by the data storage device as comprising segments of known lengths in said different format.

16. The article of manufacture of claim 15, wherein the computer program code may cause the computer to check and update a selected segment in said one format and its appended CRC check bytes without requiring checking and updating of the CRC check bytes and segments in said different format.

* * * * *